United States Patent [19]
Johnson et al.

[11] Patent Number: 6,159,509
[45] Date of Patent: Dec. 12, 2000

[54] METHOD OF MAKING CHEWING GUM PRODUCTS CONTAINING PERILLARTINE

[75] Inventors: Sonya S. Johnson, LaGrange Highlands; Robert J. Yatka, Orland Park, both of Ill.

[73] Assignee: Wm. Wrigley Jr. Company, Chicago, Ill.

[21] Appl. No.: 09/297,427

[22] PCT Filed: Oct. 28, 1996

[86] PCT No.: PCT/US96/17227

§ 371 Date: Apr. 28, 1999

§ 102(e) Date: Apr. 28, 1999

[87] PCT Pub. No.: WO98/18340

PCT Pub. Date: May 7, 1998

[51] Int. Cl.$^7$ ...................................................... A23G 3/30
[52] U.S. Cl. ................................................................ 426/3
[58] Field of Search ............................... 426/3, 6; 424/48

[56] References Cited

U.S. PATENT DOCUMENTS

| | | | |
|---|---|---|---|
| 3,608,069 | 9/1971 | Fuller | 424/52 |
| 3,656,973 | 4/1972 | Paterson et al. | |
| 3,699,132 | 10/1972 | Acton et al. | |
| 4,171,430 | 10/1979 | Matsushita et al. | 536/8 |
| 4,242,323 | 12/1980 | Vlock | 426/3 X |
| 4,374,822 | 2/1983 | Fine et al. | 424/49 |
| 4,574,081 | 3/1986 | Shymon | 424/52 |
| 4,627,974 | 12/1986 | Lynch | 424/48 |
| 4,693,888 | 9/1987 | Miyahara et al. | 424/49 |
| 5,002,759 | 3/1991 | Gaffar et al. | 426/3 X |
| 5,095,106 | 3/1992 | Gaffar et al. | 536/123 |
| 5,242,693 | 9/1993 | Kurihara et al. | 426/3 |

FOREIGN PATENT DOCUMENTS

| | | |
|---|---|---|
| 4-301913 | 6/1992 | Japan. |
| 8-238891 | 7/1995 | Japan. |
| WO 98/18340 | 5/1998 | WIPO. |

OTHER PUBLICATIONS

E.M. Acton et al., Potential New Artificial Sweetener From Study of Structure–Taste Relationships, Science, vol. 193, May 1976, pp. 584–586.

Steffen Arctander, Perfume and Flavor Materials of Natural Origin, 1960, columns 519–522.

Morten Meilgaard et al., Sensory Evaluation Techniques, 1987, pp. 14–15.

Lyn O'Brien Nabors et al., Alternative Sweeteners, 1986, pp. 314–315.

*Primary Examiner*—Arthur L. Corbin
*Attorney, Agent, or Firm*—Steven P. Shurtz; Brinks Hofer Gilson & Lione

[57] ABSTRACT

A quantity of about 50 to 5,000 ppm of perillartine is added to chewing gum to provide a chewing gum having improved sweetness and prolonged sweetness duration. The perillartine also provides unexpected oral trigeminal effects such as tingling, numbing, mouth coating and cooling/warming sensations that last throughout the entire chewing period.

13 Claims, 1 Drawing Sheet

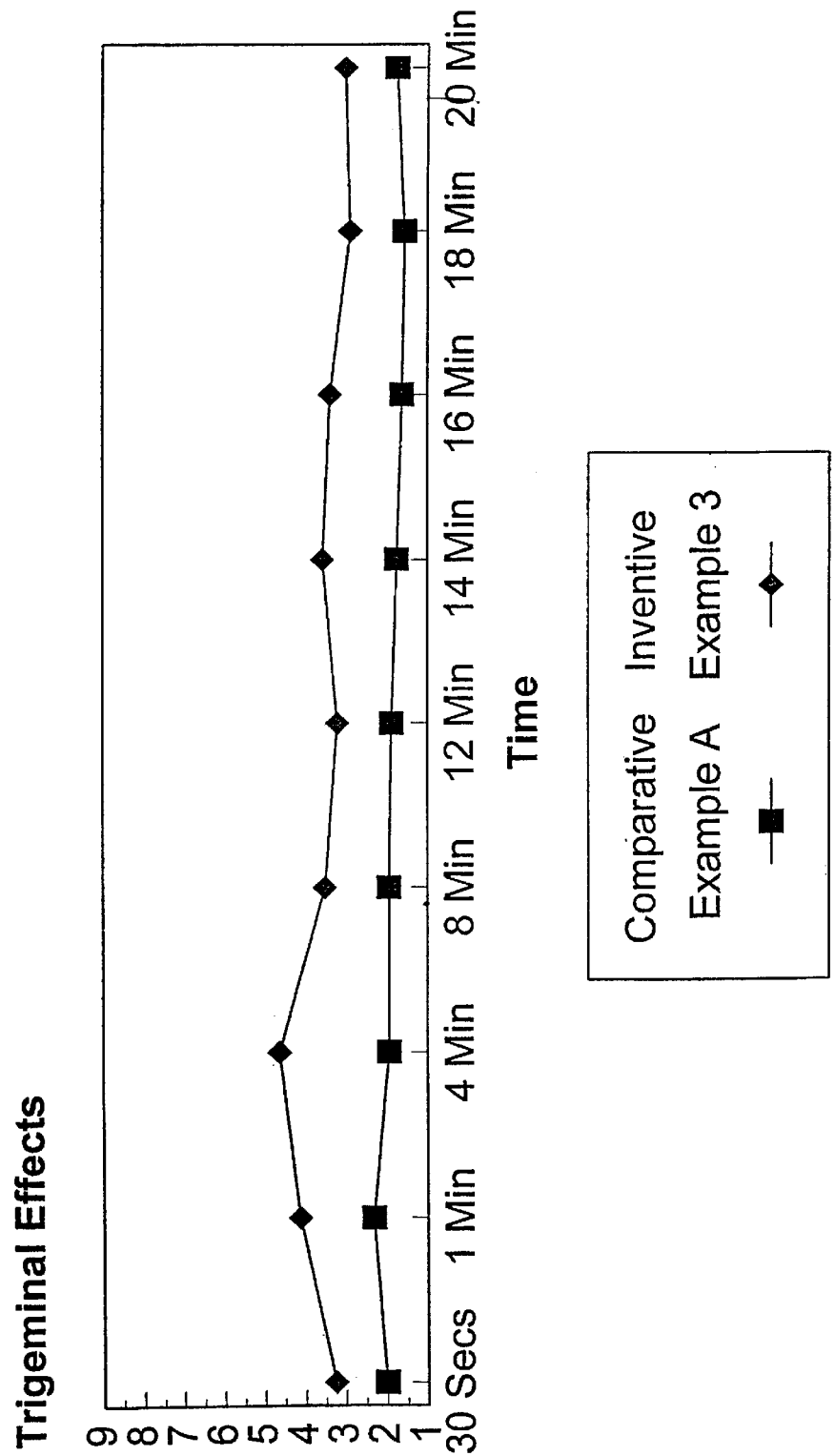

METHOD OF MAKING CHEWING GUM PRODUCTS CONTAINING PERILLARTINE

FIELD OF THE INVENTION

This invention relates generally to chewing gum products and, in particular, to chewing gum products which utilize perillartine to enhance and prolong sweetness and to provide improved sensory benefits. This invention also relates to a method of preparing a chewing gum having enhanced and prolonged sweetness and improved sensory benefits.

BACKGROUND OF THE INVENTION

Chewing gum compositions typically include gum base, flavoring and bulking and sweetening agents, as well as other optional ingredients such as softeners and coloring. Bulking and sweetening agents often include sugar, glucose syrup and high-intensity sweeteners. High-intensity sweeteners are most commonly used in conjunction with sugarless sweeteners. Sweetening agents generally are rapidly released from the chewing gum product. As a result of early release, chewing gum products tend to lose their sweetness after a short period of time. A need, therefore, exists for a method of improving and maintaining the sweetness characteristics of chewing gum products.

Perillartine is a naturally occurring aldoxime sweetener found in the oil of *Perilla namkemonsis* Deone. It is 2000 times sweeter than sucrose. The main component of Perilla oil is Perilla aldehyde. Perillartine, the anti-aldoxime of this aldehyde, can be formed synthetically from the reaction of Perilla aldehyde with hydroxylamine. Perillartine, which was first isolated and identified in 1920, can now be synthesized from limonene. While permitted as a sweetener for tobacco in Japan, additional commercial applications are limited by its bitterness, its menthol-licorice taste and its very low water solubility.

Analogues of perillartine have been developed in an effort to increase its water solubility and minimize its bitterness while maintaining its high sweetness potency. One such analogue, SRI Oxime V, is a low molecular weight aldoxime that is 450 times sweeter than sucrose. This sweetener has heat stability in baked goods and adequate acid stability for soft drinks. Another analogue is 8,9-epoxyperiliartine, which is disclosed in U.S. Pat. No. 3,699,132. This ingredient is more water soluble with little or no bitter aftertaste. Japanese patent publication No. 1992-173056 discloses a chewing gum for preventing mouth odor and/or tooth decay. Ingredients used for preventing mouth odor include substances from one or more types of plants from the Perilla family, such as rosemary or sage. Most of the other disclosures of perillartine show its use in oral compositions such as toothpaste, mouthwash, tooth powder or dental tablets for the reduction of caries or plaque or to provide other dental benefits.

SUMMARY OF THE INVENTION

According to the present invention, it has now been discovered that when perillartine is used in chewing gum, the chewing gum has improved sweetness and sweetness duration. Use of perillartine in chewing gum has a significant advantage over other sweeteners typically found in chewing gum in that perillartine is released very slowly with the flavor, thereby providing a chewing gum with a longer lasting sweetness. The use of perillartine in gum not only improves sweetness and sweetness duration, but also, unexpectedly, provides unique trigeminal oral sensations that last throughout the entire chewing period.

Thus, the present invention relates to a method of improving and maintaining sweetness and improving sensory benefits of chewing gum products by adding perillartine to the chewing gum composition. The invention also includes chewing gum products containing perillartine.

In a first embodiment, the invention is a chewing gum product having prolonged sweetness duration and improved sensory benefits comprising from about 5% to about 95% by weight gum base, from about 5% to about 95% by weight bulking and sweetening agents, from about 0.1% to about 15% by weight flavor and from about 0.005% to about 0.5% by weight perillartine.

In a second embodiment, the invention is a method of making a chewing gum product with prolonged sweetness duration and improved sensory benefits comprising the steps of forming a chewing gum composition comprising from about 5% to about 95% by weight gum base, from about 5% to 95% by weight bulking and sweetening agents from about 0.1% to about 15% by weight flavor, and adding from about 0.005% to about 0.5% by weight perillartine to the chewing gum composition.

According to the present invention, perillartine is added to chewing gum products to improve sweetness and prolong sweetness duration in chewing gum. The unexpected result is that perillartine also provides improved and long lasting sensory benefits. These sensory benefits result from stimulation of the trigeminal nerve and include, but are not limited to, tingling, numbing, mouth coating and cooling/warming sensations. The trigeminal effects also enhance the flavor of the chewing gum. These attributes could be very useful in giving the impression of long lasting flavor in products designed to give breath freshness or products designed to provide dental benefits.

The foregoing and other features and advantages will become apparent from the following detailed description of the presently preferred embodiments, when read in conjunction with the accompanying examples.

BRIEF DESCRIPTION OF THE FIGURES

FIG. 1 is a graph comparing the trigeminal effects in a chewing gum containing perillartine according to the present invention with the trigeminal effects in a chewing gum without perillartine.

DETAILED DESCRIPTION OF THE PRESENTLY PREFERRED EMBODIMENTS

As used herein, the term "chewing gum" also includes bubble gum and the like. All percentages are weight percentages unless otherwise specified.

According to the present invention, it has now been discovered that when perillartine is added to a flavor and used in chewing gum, and especially mint-flavored chewing gum, the gum has not only an improved and longer lasting sweetness, but also unique trigeminal oral sensations which last throughout the entire chewing period. Trigeminal effects result when certain chemical irritants stimulate the trigeminal nerve ends causing sensations in the mucosa of the eyes, nose and mouth. Trigeminal effects are not a taste, such as sweet or sour, nor an odor. Rather, trigeminal effects are physical oral sensations such as, for example, coolness from menthol or heat from cinnamon or pepper flavors.

The trigeminal effects resulting from the inclusion of perillartine in chewing gum are described as tingling, numbing, mouth coating and cooling/warming sensations. The trigeminal effects also impart an enhanced flavor to the chewing gum product. Analysis of chewed gum containing perillartine indicates that perillartine releases with the flavor and that a substantial portion of perillartine (about 90%) remains in the gum after 20 minutes of chewing. After 40 minutes of chewing, about 80% of the perillartine still remains in the gum. Thus, the unique sensory attributes obtained from perillartine remain during the entire chewing period.

According to the present invention, the sweetness of a chewing gum composition is enhanced by adding perillartine, generally in an amount ranging from about 50 ppm to about 5,000 ppm, more preferably from about 100 ppm to about 2,000 ppm and most preferably from about 250 ppm to about 1,000 ppm. It is believed that analogues of perillartine may also be used in the present invention, and it is expected that some analogues may give the same trigeminal effects. Because the analogues are more water soluble, however, the trigeminal effects provided by them may not be expected to remain in the gum for the entire chewing period.

Perillartine is a white, crystalline powder with a molecular weight of 165.2 and is also known as 4-isopropenyl-1-cyclohexene-1-carboxaldehyde alpha antioxime. Perillartine is available from Sigma Chemical Company of St. Louis, Mo. Perillartine may be added to chewing gum directly in its powder form or after first dissolving the powder in solvent, preferably flavor or flavor oil.

A typical chewing gum generally includes a water soluble bulk portion, a water insoluble chewing gum base portion and one or more flavoring agents. The water soluble portion dissipates over a period of time during chewing. The gum base portion is retained in the mouth throughout the chewing process.

The insoluble gum base generally includes elastomers, elastomer plasticizers (resins), fats, oils, waxes, softeners and inorganic fillers. The elastomers may include polyisobutylene, isobutylene-isoprene copolymer, styrene butadiene copolymer and natural latexes such as chicle. The resins may include polyvinyl acetate and terpene resins. Low molecular weight polyvinyl acetate is a preferred resin. Fats and oils may include animal fats such as lard and tallow, vegetable oils such as soybean and cottonseed oils, hydrogenated and partially hydrogenated vegetable oils and cocoa butter. Commonly used waxes include petroleum waxes such as paraffin and microcrystalline wax, natural waxes such as beeswax, candellia, carnauba and polyethylene wax.

The gum base typically also includes a filer component such as calcium carbonate, magnesium carbonate, talc, dicalcium phosphate and the like; softeners, including glycerol monostearate and glycerol triacetate; and optional ingredients such as antioxidants, color and emulsifiers. The gum base constitutes about 5–95% by weight of the chewing gum composition, more typically about 10–50% by weight of the chewing gum, and most commonly about 20–30% by weight of the chewing gum.

The water soluble portion of the chewing gum may include softeners, bulk sweeteners, high-intensity sweeteners, flavoring agents and combinations thereof. Softeners are added to the chewing gum in order to optimize the chewability and mouth feel of the gum. The softeners, which are also known as plasticizers or plasticizing agents, generally constitute about 0.5–15% by weight of the chewing gum. The softeners may include glycerin, lecithin and combinations thereof. Aqueous sweetener solutions such as those containing sorbitol, hydrogenated starch hydrolysates, corn syrup and combinations thereof may also be used as softeners and binding agents in chewing gum.

Bulk sweeteners constitute about 5–95% by weight of the chewing gum, more typically about 20–80% by weight of the chewing gum and most commonly about 30–60% by weight of the chewing gum. Bulk sweeteners may include both sugar and sugarless sweeteners and components. Sugar sweeteners may include saccharide containing components including but not limited to sucrose, dextrose, maltose, dextrin, dried invert sugar, fructose, levulose, galactose, corn syrup solids, glucose syrup and the like, alone or in combination. Sugarless sweeteners include components with sweetening characteristics but are devoid of the commonly known sugars. Sugarless sweeteners include but are not limited to sugar alcohols such as sorbitol, mannitol, xylitol, hydrogenated starch hydrolysates, maltitol and the like, alone or in combination.

High-intensity sweeteners may also be present and are commonly used with sugarless sweeteners. When used, high intensity sweeteners typically constitute about 0.001–5% by weight of the chewing gum, preferably about 0.01–1% by weight of the chewing gum. Typically, high-intensity sweeteners are at least twenty times sweeter than sucrose. These may include, but are not limited to sucralose, aspartame, salts of acesulfame, alitame, saccharin and its salts, cyclamic acid and its salts, glycyrrhizin, dihydrochalcones, thaumafin, monellin and the like, alone or in combination.

Combinations of sugar and/or sugarless sweeteners may be used in chewing gum. The sweetener may also function in the chewing gum in whole or in part as a water soluble bulking agent. Additionally, the softener may provide additional sweetness, such as when aqueous sugar or alditol solutions are used in the gum composition. According to the present invention, perillartine may be used in all types of sugar and sugarless chewing gum.

Flavor should generally be present in the chewing gum in an amount within the range of about 0.1–15% by weight of the chewing gum, preferably about 0.2–5% by weight of the chewing gum and most preferably about 0.5–3% by weight of the chewing gum. Flavoring agents may include essential oils, synthetic flavors or mixtures thereof, including but not limited to oils derived from plants and suits such as citrus oils, fruit essences, peppermint oil, spearmint oil, other mint oils, clove oil, oil of wintergreen, cinnamon, anise and the like. Artificial flavoring agents and components may also be used in the flavor ingredient of the invention. Natural and artificial flavoring agents may be combined in any sensorally acceptable fashion.

Perillartine may be used with various flavors such as spearmint, peppermint, fruit, cinnamon and eucalyptus. Preferably, perillarine is used with mint flavors and, even more preferably, with peppermint. In a preferred embodiment, the perillartine is premixed with the flavor and then added to a chewing gum composition comprising gum base and bulking and sweetening agents.

Optional ingredients such as colors, emulsifiers, pharmaceutical agents, and additional flavoring agents may also be included in chewing gum.

A wide range of changes and modifications to the embodiments of the invention described above will be apparent to persons skilled in the art. The following examples are not to be construed as imposing limitations on the invention, but are included merely to illustrate preferred embodiments.

EXAMPLES 1–3

The following gum formulations were made by premixing the perillartine with the peppermint flavor and then adding the perillartine/flavor mixture to the remaining ingredients.

| Ingredient | Comparative Example A | Example 1 | Example 2 | Example 3 |
| --- | --- | --- | --- | --- |
| Gum base | 19.65 | 19.65 | 19.65 | 19.65 |
| Sugar | 54.55 | 54.525 | 54.50 | 54.45 |
| Syrup-45.5 Be | 13.33 | 13.33 | 13.33 | 13.33 |
| Dextrose monohydrate | 9.90 | 9.90 | 9.90 | 9.90 |
| Glycerin | 1.42 | 1.42 | 1.42 | 1.42 |
| Lecithin | 0.25 | 0.25 | 0.25 | 0.25 |
| Peppermint flavor | 0.90 | 0.90 | 0.90 | 0.90 |
| Perillartine | — | 0.025 | 0.05 | 0.10 |
| Total | 100.00% | 100.00% | 100.00% | 100.00% |

A qualitative descriptive sensory panel using five trained judges was conducted to evaluate Example 1 (250 ppm perillartine) and Example 2 (500 ppm perillartine) against Comparative Example A. The samples were presented unidentified in a random order. The following characteristics were perceived:

1. Example 1 v. Comparative Example A: Example 1 had a slight artificial sweetness, but was also more bitter than Example A. Example 1 also provided a slight warming or numbing sensation.
2. Example 2 v. Comparative Example A: Example 2 had a higher sweetness and a higher amount of artificial sweetness than Example A. Example 2 also provided a tingling and numbing sensation.

A quantitative time-intensity panel of eight trained judges was conducted to evaluate Inventive Example 3 against Comparative Example A. Panelists were asked to rate the intensity levels of bitterness, flavor, cooling and trigeminal effects of these two examples at intervals from 30 seconds to 20 minutes of chewing. Results showed that flavor, cooling and bitterness were all higher for Example 3 throughout the chewing period, but not to a statistically significant degree. Compared to Example A, Example 3 also had a higher sweetness throughout the chewing period and a statistically higher sweetness (95% confidence level) at 4-minute and 8-minute intervals. Additionally, the trigeminal effects in Example 3 were statistically higher throughout the chewing period, as shown in Table I below and in FIG. 1, which graphically illustrates the strength of the trigeminal effects in Example 3 as compared to the strength of the trigeminal effects in Example A on a scale of 1 to 9, with 9 being "extremely strong effects" and 1 being "minimal effects." The trigeminal effects were described as tingling, numbing, mouth coating and warming sensations.

Table I shows the average values of the trigeminal effects for Example 3 and Example A at various time intervals during a 20-minute chewing period. Confidence levels are also shown in Table I for the average values of the trigeminal effects from the eight panelists. The confidence levels indicate that there is a statistically significant difference between Inventive Example 3 and Comparative Example A.

TABLE I

| | Effects in Example A | Effects in Example 3 | Confidence Level |
| --- | --- | --- | --- |
| 30 seconds | 2.0000 | 3.2500 | 95% |
| 1 minute | 2.3125 | 4.1250 | 99% |
| 4 minutes | 1.9375 | 4.6250 | 99% |
| 8 minutes | 1.9375 | 3.5000 | 95% |
| 12 minutes | 1.8750 | 3.1875 | 95% |
| 14 minutes | 1.7500 | 3.5625 | 95% |
| 16 minutes | 1.6250 | 3.3750 | 95% |
| 18 minutes | 1.5625 | 2.8750 | 95% |
| 20 minutes | 1.7500 | 3.0000 | 95% |

Based on the foregoing, it was concluded that the addition of perillartine to chewing gum compositions causes noticeable improvements in sweetness and sweetness duration of chewing gum. Moreover, the addition of perillartine to chewing gum products unexpectedly provided unique trigeminal oral sensations.

It should be appreciated that the methods and compositions of the present invention are capable of being incorporated in the form of a variety of embodiments, only a few of which have been illustrated and described above. The invention may be embodied in other forms without departing from its spirit or essential characteristics. It will be appreciated that the addition of some other ingredients, process steps, materials or components not specifically included will have an adverse impact on the present invention. The best mode of the invention may therefore exclude ingredients, process steps, materials or components other than those listed above for inclusion or use in the invention. However, the described embodiments are to be considered in all respects only as illustrative and not restrictive, and the scope of the invention is, therefore, indicated by the appended claims rather than by the foregoing description. All changes which come within the meaning and range of equivalency of the claims are to be embraced within their scope.

We claim:

1. A method of making a chewing gum product with improved sensory benefits comprising the steps of:
   a) forming a chewing gum composition comprising from about 5% to about 95% gum base, from about 5% to 95% bulking and sweetening agents and from about 0.1% to about 15% flavor; and
   b) adding from about 0.005% to about 0.5% perillartine to the chewing gum composition;
   wherein the perillartine is first combined with the flavor, and the perillartine/flavor mixture is then added to the gum base and the bulking and sweetening agents to form the chewing gum product having improved sensory benefits and the improved sensory benefits are oral, trigeminal effects.

2. The method of claim 1 wherein the oral, trigeminal effects include tingling, numbing, mouth coating and cooling/warming sensations.

3. The method of claim 1 wherein the bulking and sweetening agents comprise sugar and glucose syrup.

4. The method of claim 1 wherein the flavor is a mint flavor.

5. The method of claim 4 wherein the mint flavor is peppermint.

6. The method of claim 1 wherein said perillartine is present at a level of about 0.01% to about 0.2% by weight of the chewing gum composition.

7. The method of claim 1 wherein said perillartine is present at a level of about 0.025% to about 0.1% by weight of the chewing gum composition.

8. The method of claim 1 wherein the chewing gum composition is a sugarless chewing gum.

9. The method of claim 8 wherein the oral, trigeminal effects include tingling, numbing, mouth coating and cooling/warming sensations.

10. The method of claim 9 wherein the flavor is a mint flavor.

11. The method of claim 10 wherein the mint flavor is peppermint.

12. The method of claim 11 wherein said perillartine is present at a level of about 0.01% to about 0.2% by weight of the chewing gum composition.

13. The method of claim 11 wherein said perillartine is present at a level of about 0.025% to about 0.1% by weight of the chewing gum composition.

* * * * *